(12) United States Patent
Shah et al.

(10) Patent No.: US 6,666,047 B1
(45) Date of Patent: Dec. 23, 2003

(54) HIGH PRESSURE POLARIZER FOR HYPERPOLARIZING THE NUCLEAR SPIN OF NOBLE GASES

(75) Inventors: Nadim Joni Shah, Julich (DE); Stephan Appelt, Julich (DE); Timur Unlu, Haan (DE); Horst Halling, Inden-Pier (DE); Karl Zilles, Cologne (DE)

(73) Assignee: Forschungszentrum Julich GmbH, Julich (DE)

( * ) Notice: Subject to any disclaimer, the term of this patent is extended or adjusted under 35 U.S.C. 154(b) by 0 days.

(21) Appl. No.: 10/049,721

(22) PCT Filed: Jul. 27, 2000

(86) PCT No.: PCT/EP00/07217

§ 371 (c)(1),
(2), (4) Date: Mar. 27, 2002

(87) PCT Pub. No.: WO01/11379

PCT Pub. Date: Feb. 15, 2001

(30) Foreign Application Priority Data

Aug. 9, 1999 (DE) .......................... 199 37 566

(51) Int. Cl.$^7$ .............................. F25J 3/00; A61B 5/05; A61N 1/30; A61M 5/00
(52) U.S. Cl. ............ 62/637; 62/3.1; 600/420; 604/20; 604/181
(58) Field of Search ................ 62/637, 3.1, 919, 62/49.1; 600/420; 604/20, 181

(56) References Cited

U.S. PATENT DOCUMENTS

| | | | | |
|---|---|---|---|---|
| 5,642,625 A | * | 7/1997 | Cates et al. ............. | 62/55.5 |
| 6,305,190 B1 | * | 10/2001 | Driehuys et al. .......... | 62/637 |
| 6,430,939 B2 | * | 8/2002 | Hasson et al. ............ | 62/49.1 |
| 6,430,960 B1 | * | 8/2002 | Driehuys ................. | 62/637 |
| 6,471,747 B1 | * | 10/2002 | Venkatesh et al. ........ | 95/90 |

* cited by examiner

Primary Examiner—William C. Doerrler
(74) Attorney, Agent, or Firm—Merchant & Gould P.C.

(57) ABSTRACT

The invention relates to a polarizer for noble gases comprising a glass sample cell and a pressure chanter in which the sample cell is located. High pressure and accompanying broadband or narrow-band lasers can be similarly provided in an optimal manner. To this end, the polarizer is operated at pressures of 30 bar and higher.

10 Claims, 1 Drawing Sheet

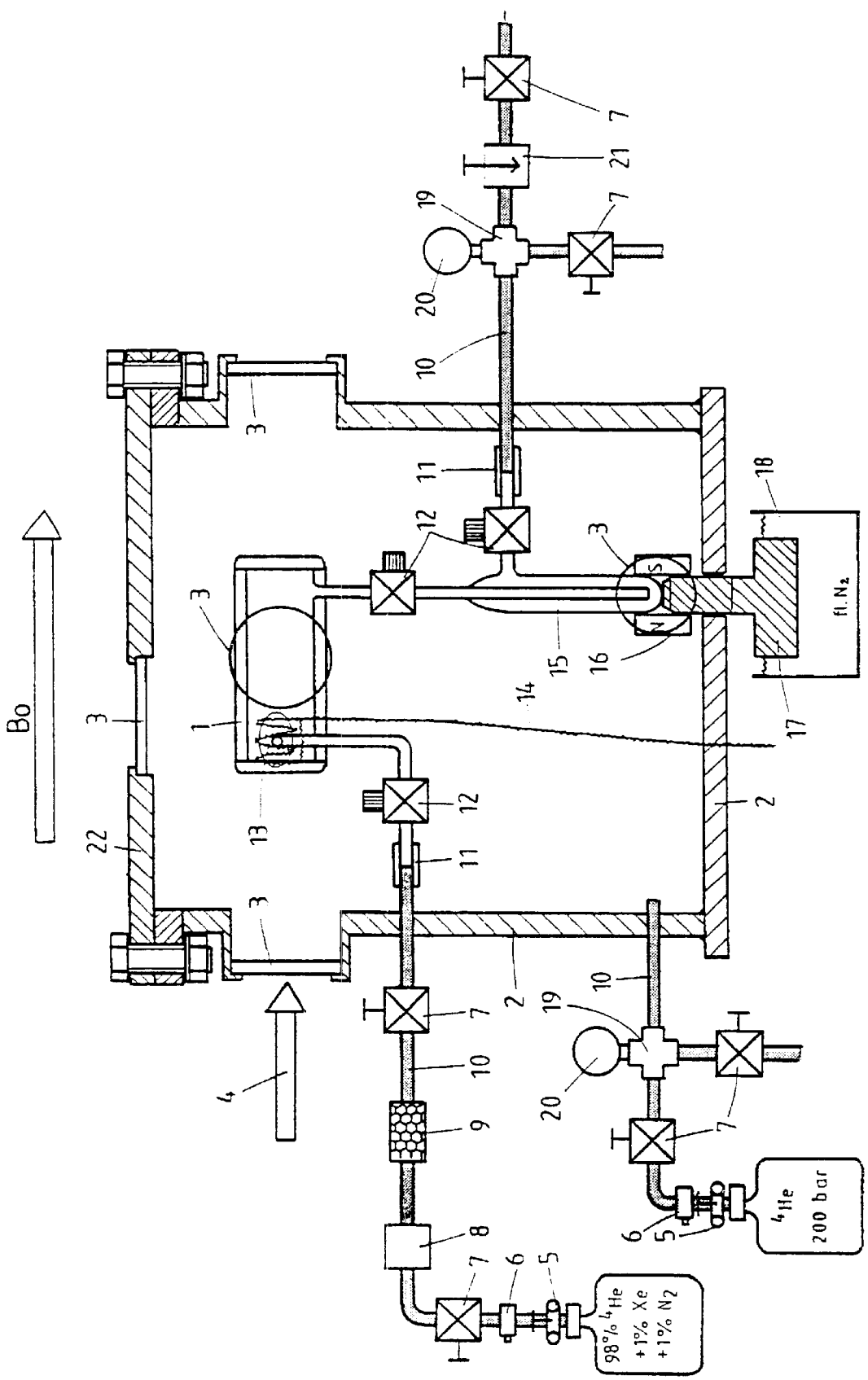

HIGH PRESSURE POLARIZER FOR HYPERPOLARIZING THE NUCLEAR SPIN OF NOBLE GASES

The invention concerns an apparatus with devices comprising glass for the polarization of noble gases in the sample cell. The invention further concerns a method of operating the apparatus.

Recent developments in magnetic resonance tomography (MRT) and in magnetic resonance spectroscopy (NMR) with polarized noble gases lead to the expectation of uses in medicine, physics and material sciences. High levels of polarization of nuclear spins of noble gases can be achieved by optical pumping by means of alkali metal atoms, as can be seen from the publication Happer et al, Phys. Ref. A, 29, 3092 (1984). Typically at the present time the alkali metal atom rubidium is used in the presence of a noble gas and nitrogen. It is possible in that way to achieve nuclear spin polarization of the noble gas xenon ($^{129}$Xe) of about 20 percent. Such a level of nuclear spin polarization is about 100,000 times greater than the equilibrium polarization in clinical magnetic resonance tomographs. The drastic increase in the signal-noise ratio, which this involves, explains why in future new possible uses are expected in medicine, science and technology.

The term polarization is used to denote the degree of orientation (order) of the spins of atomic nuclei or electrons. 100 percent polarization means for example that all nuclei or electrons are oriented in the same fashion. The polarization of nuclei or electrons involves a magnetic moment.

Polarized xenon is for example inhaled by or injected into a human being. Between 10 and 15 seconds later the polarized xenon collects in the brain. The distribution of the noble gas in the brain is detected by means of magnetic resonance tomography. The result is used for further analysis procedures.

The choice of the noble gas depends on the situation of use. $^{129}$Xenon involves a large chemical shift. If xenon is adsorbed for example on a surface its resonance frequency significantly changes. In addition xenon is dissolved in fat-loving (that is to say: lipophilic) liquids. If properties of that kind are wanted, xenon is used.

The noble gas helium scarcely dissolves in liquids. The isotope $^3$helium is therefore used regularly when cavities are involved. The lung of a human being represents an example of such a cavity.

Some noble gases have valuable properties other than those referred to above. Thus for example the isotopes $^{83}$krypton, $^{21}$neon and $^{131}$xenon have a quadrupole moment which is of interest for example in experiments in basic research or surface physics. Those noble gases however are very expensive so that they are not suitable for uses in which relatively large amounts are used.

It is known from the publication "B. Driehuys et al., Appl. Phys. Lett. 69, 1668 (1996)" for noble gases to be polarized in the following manner in a polarizer.

Circularly polarized light is provided by means of a laser, that is to say light in which the rotational impulse or spin of the photons are all in the same direction. The rotational pulse of the photons is transmitted to free electrons of alkali metal atoms. The spins of the electrons of the alkali metal atoms therefore have a great deviation from thermal equilibrium. The alkali metal atoms are consequently polarized. By a collision of an alkali metal atom with an atom of a noble gas, the polarization of the electron spin is transferred from the alkali metal atom to the atom of the noble gas. That results in polarized noble gas.

Alkali metal atoms are used as they have a high optical dipole moment which interacts with the light. In addition alkali metal atoms each have a free electron so that no detrimental interactions can occur between two and more electrons per atom.

Cesium would be a particularly well-suited alkali metal atom which is superior in relation to rubidium to achieve the above-indicated effects. At the present time however there are no lasers available with a sufficiently high level of power, as would be required for the polarization of xenon by means of cesium. There is however the expectation that in future lasers with power levels of around 100 watts on the cesium wavelength will be developed. In that case cesium will probably be preferably used for the polarization of xenon gas.

In accordance with the state of the art, a gas mixture is passed slowly under a pressure of typically between 7 and 10 bars through a cylindrical glass cell. The gas mixture comprises for example 98 percent of $^4$helium, one percent of nitrogen and one percent of xenon. The typical speeds of the gas mixture are some ccm per second.

The gas mixture firstly flows through a vessel (hereinafter referred to as the "supply vessel") in which there is about one gram of rubidium. The supply vessel with the rubidium therein is heated together with the adjoining glass cell to between about 100 and 150 degrees Celsius. The rubidium is evaporated by the provision of those temperatures. The concentration of the evaporated rubidium atoms in the gas phase is determined by the temperature in the supply vessel. The gas flow transports the evaporated rubidium atoms from the supply vessel into the cylindrical sample cell. A powerful, circularly polarized laser (100 watt output in continuous operation) irradiates the sample cell which is generally a cylindrical glass cell, axially, and optically pumps the rubidium atoms into a highly polarized condition. In this case the wavelength of the laser must be matched to the optical absorption line of the rubidium atoms (D 1—line). In other words: in order to optimally transfer the polarization of light to an alkali metal atom, the frequency of the light must coincide with the resonance frequency of the optical transition. The sample cell is in a static magnetic field $B_0$ of a few 10 Gauss, which is produced by coils—in particular a so-called Helmholtz coil pair. The direction of the magnetic field extends parallel to the axis of the cylindrical configuration of the sample cell or parallel to the laser beam direction. The magnetic field serves to guide the polarized atoms.

The rubidium atoms which are optically highly polarized by the light of the laser collide in the glass cell inter alia with the xenon atoms and deliver their high level of polarization to the xenon atoms. At the outlet from the sample cell the rubidium is deposited at the wall by virtue of the high melting point in comparison with the melting points of the other gases. The polarized xenon or the residual gas mixture is conducted from the sample cell into a freezing-out unit. This comprises a glass flask whose end is immersed in liquid nitrogen. The glass flask is further disposed in a magnetic field of a strength of between 1000 and 2000 Gauss. The highly polarized xenon gas is deposited in the form of ice at the inside glass wall of the freezing unit. At the outlet from the freezing unit the remaining gas (helium and nitrogen) is passed by way of a needle valve and finally discharged.

The flow speed in the entire arrangement can be controlled by way of the needle valve and measured with a measuring device. If the flow speed rises excessively greatly, there is no time remaining for transfer of the polarization effect from the rubidium atoms to the xenon atoms. No polarization is therefore achieved. If the flow speed is too low, too much time elapses before the desired amount of highly polarized xenon has frozen. More specifically due to relaxation the polarization of the xenon atoms decreases again. Relaxation of the xenon atoms is greatly slowed down by the freezing effect and due to the strong magnetic field to which the freezing unit is exposed. It is therefore necessary for the noble gas xenon to be frozen after the polarization operation as quickly as possible and without loss. Admittedly, it is not possible to avoid relaxation, by virtue of the freezing procedure. However, between 1 and 2 hours still remain before xenon polarization has fallen so greatly that further use of the initially highly polarized gas is no longer possible.

A polarizer of the above-indicated kind always has connecting locations. Connecting locations are those at which at least two conduits through which polarized gas is conducted are connected together. The conduits generally comprise glass. The connection is made by a connecting element such as for example flanges.

The light of the laser which produces the polarization effect is absorbed in the sample cell. The intensity of the light and thus the degree of polarization of the alkali metal atoms in the sample cell correspondingly decreases. For technical reasons, the cross-section of the sample cell is generally not uniformly stimulated by the light of the laser. Consequently the alkali metal atoms are not uniformly polarized. Interactions with the walls of the sample cell also change polarization of the alkali metal atoms along the cross-section of the sample cell. Consequently the polarization of the alkali metal atoms changes in the sample cell, in dependence on the location therein.

In order to polarize a single free alkali metal atom a certain amount of energy is required. That required energy corresponds to the resonance frequency for raising the free electron of the alkali metal atom from a ground state to an excited state. In order to optimally transfer the energy from a laser to the alkali metal atom, the frequency of the light of the laser must be tuned to the resonance frequency of the alkali metal atom. Inexpensive lasers emit their light within a given frequency spectrum. This therefore does not involve an individual frequency but a distribution of frequencies. The available spectrum of a laser is characterized by a so-called line width. In order to polarize alkali metal atoms economically, lasers are provided, whose frequency and line width are tuned to the resonance frequency and optical line width respectively of the alkali metal atom.

In order to be able to better transfer the energy from a laser to alkali metal atoms, collision partners are provided for the alkali metal atoms during polarization. In particular $^4$helium atoms serve as collision partners. Due to the interaction or the collisions with the helium atoms, the optical line width of an alkali metal atom is widened. The wider that atomic spectrum is, the correspondingly more is it possible to use spectrally wide and thus inexpensive lasers.

The number of collisions between an alkali metal atom and a collision partner such as helium increases, in proportion to increasing pressure. For $^4$helium for example the pressure broadening of the optical line width of the alkali metal atom is proportional to the pressure of the helium gas. In addition helium enjoys the valuable property that it has only a little disturbing influence on polarization of the alkali metal atoms. Therefore, in the polarization of alkali metal atoms by a laser, operation is usually implemented with a gas mixture which comprises 98 percent helium and is at a pressure of about 10 bars.

The 100 watt laser used in accordance with the state of the art involves a glass fiber-coupled diode laser with a typical spectral width of between 2 and 4 nanometers. With a gas pressure of 10 bars the line width of the optical transition of rubidium atoms is widened to about 0.3 nanometer. Therefore, in the present rubidium-xenon polarizers in which expensive diode lasers with typically a 2 nanometer line width are used for the optical pumping procedure, only a fraction of the laser light is put to use.

The partial pressures of helium are at the present time up to 10 bars in a gas mixture in accordance with the state of the art. That is very high in comparison with the other partial pressures (xenon and nitrogen respectively). That relatively high partial pressure means that polarized atoms only rarely reach the sample wall of the glass cell and there lose their polarization for example due to interaction with paramagnetic centers. With increasing helium partial pressure, there is a decreasing probability of polarized atoms disadvantageously impacting against the cell wall.

In order to use the full laser power and at the same time to reduce disadvantageous relaxation effects due to collisions with the wall, operation had to be implemented at helium pressures far above 30 bars. That is not possible in the state of the art.

In terms of the composition of the gas mixture, the following is also to be borne in mind.

A polarized alkali metal atom such as for example rubidium can produce fluorescence radiation. If such radiation is captured by a further polarized alkali metal atom that capture results in depolarization of the alkali metal atom. The nitrogen in the gas mixture, which is used in the polarization of noble gases, serves for capture of that fluorescence radiation in order to reduce the above-mentioned unwanted depolarization effect. The element nitrogen in the gas mixture, like xenon, has only a low partial pressure. That partial pressure is typically 0.1 bar in the state of the art.

The heavy noble gas atoms such as for example xenon atoms, upon collisions with the alkali metal atoms, cause severe relaxation of the polarization of the alkali metal atoms. In order to keep polarization of the alkali metal atoms as high as possible in the optical pumping procedure, the partial pressure of the xenon gas in the gas mixture must be correspondingly low. Even with a xenon partial pressure in the gas mixture of 0.1 bar, laser outputs of around 100 watts are used in order to achieve polarization of the alkali metal atoms of 70 percent in the entire sample volume.

The state of the art involves using glass cells which are blown from one piece of glass. It was hitherto not possible to produce a glass cell, in some other fashion, which could withstand the desired high pressures. The consequence of the above-indicated manner of manufacture of the glass cell is that the windows through which the laser light enters and exits are always curved or rounded. Unwanted disadvantageous lens effects occur in the entry or exit of the laser light. The light of the laser is focused or expanded. That causes a considerable worsening in terms of the effectiveness of polarizing alkali metal atoms in the gas mixture of the glass cell.

A glass cell for the polarization of noble gases should satisfy the following demands:

It should be non-magnetic or resistant in relation to alkali metals at temperatures of up to 200 degrees Celsius and pressure-resistant.

It should be possible to close the glass cell with valves. The valve heads should withstand 200 degrees Celsius in the presence of the gas mixture, in addition they should be non-magnetic and pressure-resistant. The influence of the valves on polarization of the noble gas should be as low as possible.

The surface in the interior of the cell should have no disturbing influence on xenon or on rubidium polarization. There should therefore be no para- or indeed ferromagnetic centers at the inside wall of the cell. The material of which the cell is made up should also be absolutely non-magnetic.

It should be possible for the light of the laser to be propagated through the cell as far as possible without any lens effects, that is to say parallel.

The entry window of the cell should absorb the light of the laser as little as possible. Otherwise the window is excessively heated and finally destroyed.

The entry window should not be birefringent either at normal pressure or at high pressure. Otherwise circular polarization of the laser would be destroyed or at least reduced.

Overall therefore it is desirable for a noble gas to be polarized at pressures of far above 30 bars. The sample cell which comprises glass should be subjected to the minimum possible loading, due to the high pressures.

The object of the invention is to provide a polarizer for noble gases, in which broad-band and narrow-band lasers can be equally used in the optimum fashion.

The object of the invention is attained by an apparatus having the features of the first claim. A method of operating the apparatus has the features of the further independent claim. Advantageous configurations are set forth in the appendant claims.

The polarizer set forth in claim 1 includes a sample cell. A gas mixture which contains inter alia noble gases and alkali metal atoms is conducted into the sample cell. The alkali metal atoms are polarized by means of a laser. The polarized alkali metal atoms deliver their polarization to the noble gases. The polarized noble gases are then fed in particular to a freezing unit. In particular the noble gases xenon and krypton can be frozen out at viable cost in technical and financial terms. The sample cell comprises glass and more specifically in particular borosilicate glass. The sample cell advantageously has at least one entry window for the polarizing light beam, the window comprising flat glass, in particular borofloat glass. The window or windows comprising flat glass are then fused to the rest of the glass of the sample cell. Conduits which lead into and out of the sample cell are also made of glass. The glass elements of the apparatus such as sample cell, supply vessel or freezing-out unit are disposed in a pressure chamber. The term pressure chamber is used to mean a pressure chamber which is capable of withstanding a pressure of 30 bars and more. The walls of the chamber in particular comprise non-magnetic high-quality steel as that material is particularly stable and is thus well-suited to withstanding a pressure of at least 30 bars. The specified glass and the advantageous structure of the sample cell with the windows comprising flat glass particularly satisfies the above-mentioned demands made on the sample cell.

A pressure which corresponds to the pressure in the sample cell is produced in the interior of the pressure chamber. That provides that the glass is not exposed to any pressure difference or only a very slight pressure difference. It is possible without problems for the pressure difference to be a few bars. The entire glass arrangement is thus subjected to an only slight pressure loading. The thickness of the glass used can be small. The optical quality of the window through which the laser light passes into the sample cell can be enhanced in that way.

It is also readily possible to produce a pressure of 30 bars and more in the sample cell and accordingly to attain the object of the invention. The pressure can be so selected that the respective spectral width of a laser is adapted to the optical line width of the alkali metal atom used. In particular polarization-destroying contacts of the noble gas atoms at high pressures of substantially more than 10 bars with the wall are avoided. Overall with the polarizer according to the invention, with a comparatively freely selectable pressure, it is possible to surpass the power of a conventional polarizer operating at 10 bars, by a multiple. Typical wall thicknesses of the glass are between 2 and 5 mm.

The gas in the sample cell substantially corresponds in terms of its composition to the gas in the pressure cell outside the sample cell. If the gas mixture in the sample cell substantially comprises for example helium, then the gas in the pressure cell also advantageously or for simplicity completely comprises helium. It is readily possible in that manner to protect the sample cell from impurities such as for example oxygen in the air. In addition, in the event of minor leaks, only helium passes into the sample cell so that such leaks are not critical. It will be appreciated that in general terms gases such as argon in the pressure cell (outside the sample cell) are also sufficient to ensure the important protection from oxygen in the air and to ensure pressure equalization.

By way of example, rubidium atoms are pumped at the most efficient when the spectral width of the laser is precisely as great as the spectral width of the optical transition of the rubidium atoms. It is known that, when using helium gas, the broadening of the optical transition of alkali metal atoms is proportional to the helium pressure. For example the rubidium $D_1$—line (794.8 nanometers) is broadened at a helium pressure of 10 bars to $\Delta\lambda=0.35$. When using a laser with an output power of 100 watts and a spectral width of 2 nanometers, the optimum in terms of efficiency occurs at between about 50 and 60 bars helium pressure. Even when using a powerful laser diode module (which is made up of a multiplicity of laser diodes) with a spectral width of only one nanometer, 30 bars pressure is required in order to make optimum use of the energy of the laser for polarization purposes. Those details make it clear why the consequence of the increase in pressure to 30 bars and more is a substantial increase in power.

In an advantageous embodiment of the invention therefore the pressure chamber is so designed that it can withstand at least 50 bars pressure. In particular that requirement also applies in regard to the parts which are also subjected to that pressure. That applies for example in particular for connected pipes which preferably also comprise high-quality steel. This also involves for example the needle valve, shut-off valves and connected measuring units such as for example a pressure measuring unit or a flowmeter for measuring the speed of the flowing gas.

The pressure chamber is in particular provided with a cover which can be removed. The actual elements of the polarizer can be introduced into the pressure chamber or if necessary replaced, through the chamber which is then open.

Advantageously the chamber also has bull's eyes or portholes of thick glass. The bull's eyes are fitted into the walls of the pressure chamber in the manner known from diving bells. Two portholes can then serve as entry and exit windows for the laser beam with which the alkali metal atoms are polarized in the sample cell. Further portholes serve for observation purposes. For example, by way of the further portholes, a further laser beam can pass for example for test purposes through the sample cell in order to measure the distribution of polarization in the sample cell, on the basis of absorption of the light from that laser. In addition, through a porthole, it is also possible to establish how far the procedure in freezing out gas (in particular xenon gas) has advanced in the freezing-out unit.

If portholes are provided for observation purposes, it is particularly advantageous to produce the pressure in the pressure chamber by means of gases like helium. Gases like helium are free of water. That therefore avoids water condensing on the freezing-out unit or the portholes or even forming a layer of ice on the freezing-out unit. Therefore in an advantageous embodiment of the invention the pressure chamber is connected to a helium tank by way of a high-quality steel pipe, a pressure-reducing device, a pressure measuring unit and valves. The helium gas in the helium tank is at a pressure of for example 150 bars. The pressure chamber can be controlledly brought to the desired helium pressure of for example 50 bars with the pressure-reducing device and the valves.

In an advantageous embodiment of the invention the pressure obtaining in the glass components is above the pressure in the rest of the pressure chamber. The pressure difference is typically between 1 and 2 bars. That further ensures that no impurities can pass out of the pressure chamber into the sample cell and so forth.

The provision of the pressure chamber means that the devices used hitherto cannot be further used or cannot be readily further used. Only a limited amount of space is generally available in the pressure chamber so that previous devices can be disposed in the pressure chamber with difficulty or not at all. For example the access to the freezing-out unit in the closed pressure chamber is made considerably more difficult. In an advantageous embodiment of the invention therefore a metal bar is for example screwed in a wall of the pressure chamber. That metal bar comprises in particular a metal such as for example copper which can conduct heat particularly well. The one end of the metal bar is in contact with a part of the freezing-out unit. Cooling means are disposed at the other end of the metal bar, which is accessible from the exterior (outside the pressure chamber). In particular liquid nitrogen is used as the cooling means. By virtue of the thermal conductivity of the metal the temperature at the freezing-out unit will not deviate substantially from the temperature of liquid nitrogen (77 Kelvin). By virtue of that design configuration of the invention therefore cooling of the freezing-out unit is possible in a simple fashion.

Magnets are arranged in the region in which the noble gas is frozen out in the freezing-out unit. A magnetic field of above 1000 Gauss is generated with those magnets. In particular the strength of the magnetic field is 2000 Gauss. By way of example, magnets which comprise neodymium-iron-boron and/or which are in the form of jaw magnets are used. Such magnets make it possible to achieve the desired high magnetic fields strengths. The magnetic field prevents the disintegration of polarization of the noble gas in the ice condition. For example at a temperature of Kelvin and with a magnetic field of 2000 Gauss the $(T_1-)$ relaxation time of polarized xenon is between about one and two hours.

In order for example to produce one gram of polarized xenon-ice in a polarizer in accordance with the state of the art, a time of between half an hour and a full hour is required. Because of the much higher level of efficiency of the polarizer according to the invention, for example one gram of polarized xenon-ice can be obtained in about 10 minutes. The loss of xenon polarization is negligible in that period. The apparatus according to the invention is therefore advantageous not only by virtue of the higher yield but also for the reason that production can be implemented very rapidly therewith.

It will be appreciated that it is also possible to cool the metal bar by means of a helium cryostat to about 20 Kelvin. At 20 Kelvin the relaxation time of polarization of xenon-ice is about one day. Therefore xenon in that condition can be stored or accumulated longer.

At the other end of the metal bar which is accessible from the exterior (outside the pressure chamber), in a further advantageous embodiment of the invention, are means for heating the metal bar. Heating of the metal bar causes the xenon-ice in the freezing-out unit to be rapidly heated. More specifically, the inventors found that a large part of polarization is lost when xenon-ice thaws slowly. The process is considerably speeded up by using the means for heating the metal bar. Polarization losses are further avoided in that way.

In the state of the art, the sample cell and the supply vessel are heated with hot air. That process is used in rubidium-xenon polarizers in particular for the reason that only slight magnetic fields are produced at the location of the sample. Hot air is transported by way of a long hose to the location of the sample or to the location of the sample cell. That heating process can scarcely be implemented within a high-pressure chamber. Therefore, in a further embodiment of the invention, it is advantageous for the heating operation to be effected in accordance with one of the following methods or by means of one of the following apparatuses.

In a next configuration of the invention, the supply vessel and the entry window of the sample cell is locally heated with a high-frequency heating means. The entry window is heated so that rubidium metal cannot be deposited on the entry window. Otherwise the laser light would be detrimentally adversely affected. The high-frequency heating means is embodied for example by a heating wire which is wound around the supply vessel and around the entry window of the sample cell.

The high-frequency heating means deliberately heats only the part which has to be heated in order to achieve the desired effects. Heating is therefore implemented in an effective manner.

Electrically conductive surfaces are heated by high-frequency heating and thus the rubidium metal in the supply vessel is heated up. In order further to improve the effectiveness of heating, a further advantageous embodiment of the invention provides that the alkali metal is applied to a wire mesh which in particular comprises copper within the supply vessel. The metal of which the wire mesh is made should not be magnetic and in addition it should be a noble metal. Therefore for example platinum or silver fall to be considered as the material involved. By virtue of that configuration of the invention, the surface area of the rubidium metal is substantially increased. As a consequence the heating power required is greatly reduced.

The frequency at which the high-frequency heating means is operated is to be so selected that the basic frequency and the harmonic or sub-harmonic frequencies differ substantially from the resonance frequency of the noble gas to be polarized, that is to say for example xenon. Otherwise polarization of the noble gas would be destroyed. For example the resonance frequency of xenon is typically between 10 and 50 kHz. Typical frequencies for operation of the HF-heating means are between 1 and 2 MHz.

In a further embodiment of the invention the alkali metal in the supply vessel is evaporated by heating by means of a laser. Broad-band lasers of for example between 4 and 5 nanometers, which in particular have a wavelength of about 795 nanometers, are particularly well suited. The power of such a laser is typically 30 watts. The laser used is in particular a diode bar as that is inexpensive.

Advantageously, the laser light is focused by means of lenses. The laser light is deflected for example through an observation window onto the rubidium metal in the supply vessel. Heating by means of a laser affords the advantage that no troublesome magnetic fields are produced. In addition no wire and the like has to be introduced into the high-pressure chamber.

A further advantageous embodiment of the invention includes means which heat the gas feed conduit to the sample cell. That causes heating of the gas mixture which is fed to the supply vessel or the sample cell respectively. The means for heating the feed conduit are in particular an oil bath which is raised for example by electrical heating to a desired temperature. If for example silicone oil is used, that bath can be heated to up to 200 degrees Celsius.

This method, like the heating method by means of a laser, involves the problem that a disadvantageous deposit can occur on the entry window in the sample cell. To resolve that problem a further embodiment of the invention provides for doping of the entry window, by which the light of the laser is absorbed to an increased degree. The entry window then automatically heats up and the unwanted deposit is prevented.

Chromium is a suitable substance with which the window can be advantageously doped so that the window heats up in the above-indicated manner.

The FIGURE illustrates the basic structure of an embodiment of the invention.

A sample cell 1 is disposed in a pressure vessel or a pressure container 2. The pressure container 2 is made from non-magnetic V4A steel. The pressure container 2 has sight windows 3 in the form of bull's eyes or portholes. Disposed outside the pressure container 2 is a laser whose light 4 passes through a first sight window 3 into the interior of the pressure container 2, then passes through the sample cell 1 and leaves the pressure container 2 again by way of a further window 3.

A gas mixture is introduced into the sample cell 1. The gas mixture is disposed in a supply container at a pressure of 150 bars. It is for example of the following composition: 98% by volume of $^4$helium, 1% by volume of xenon and 1% by volume of nitrogen. The gas mixture is firstly fed to a pressure-reducing device 5 by way of a conduit. From there it goes to a spill valve 6. Connected downstream of the valve 6 is a shut-off valve 7. The gas mixture then passes through a flowmeter 8 with which the amount of flowing gas can be measured. The gas mixture then passes through a gas cleaner 9 and then goes to a further shut-off valve 7. The associated pipelines 10 are made from V4A steel and are of an inside diameter of 3 mm. The pipe 10 passes through a wall of the pressure container 2. A connecting portion 11 connects the pipe 10 to a glass conduit. The glass conduit firstly opens into a shut-off valve 12 comprising glass. From there the glass conduit goes on to a supply container or a supply vessel 13. A heating winding 14 is wound around the supply vessel 13. The heating winding 14 is operated with a high-frequency current. The supply vessel 13 is then heated. During operation, disposed in the supply vessel 13 is alkali metal which is evaporated here. The evaporated alkali metal passes together with the above-mentioned gas mixture into the sample cell 1.

Polarization of the alkali metal atoms or the noble gas takes place in the sample cell 1 in the above-described manner. The gas mixture is then passed out of the sample cell and firstly goes to a further glass shut-off valve 12. That further glass shut-off valve 12 is followed by a freezing-out unit 15. Arranged at the lower end of the unit 15 is a permanent magnet 16. The gas mixture with the polarized noble gas atoms is exposed to a strong magnetic field, by means of the permanent magnet 16. In that way detrimental relaxation phenomena are reduced. A bar 17 comprising copper, also referred to herein as the copper finger, leads out of the pressure container 2 and is immersed outside the pressure container 2 in liquid nitrogen. The nitrogen is in a Dewar vessel 18. The copper finger 17 touches the end of the freezing-out unit 15 which is in the homogenous region of the strong magnetic field. In that way, that end of the freezing-out unit 15 is cooled so greatly that the polarized noble gas freezes out in the strong magnetic field.

The remaining gas is passed out of the pressure container 2 from the unit 15 by way of a glass shut-off valve 12, a connecting portion 11 and a pipe 10 comprising V4A steel. The gas mixture then goes to a cross portion 19 which is connected to a manometer 20, a shut-off valve 7 and a needle valve 21. The discharge flow is regulated by the needle valve 21. The obtaining pressure within the pressure chamber or the glass unit is monitored by means of the two manometers 20 shown in the Figure. Arranged downstream of the needle valve 21 is a further shut-off valve 7. Disposed in a further gas bottle or a gas container is $^4$helium at a pressure of 200 bars. The helium gas is introduced into the pressure vessel 2 through a pipe comprising V4A, by way of a pressure-reducing device 5, a spill valve 6 and a cross portion 19. The cross portion 19 is also connected to a manometer 20 in order to be able to monitor the pressure. A conduit also leads from the cross portion 19 to a shut-off valve 7. In that way, an operating pressure of up to 50 bars can be produced in the interior of the pressure container 2, outside the sample cell. That pressure is provided by the helium gas. A comparably high operating pressure can then advantageously be provided in the interior of the sample cell 1. The pressure vessel 2 has a cover 22 which can be opened in order if necessary to remove or replace parts of the polarization device.

What is claimed is:

1. A polarizer for noble gases comprising glass, and a pressure chamber (2) in which are disposed devices comprising glass, said pressure chamber comprising a freezing-out unit(15) which is disposed in the pressure chamber and which is connected to the sample cell (1) by way of a pipe comprising glass, a metal bar (17) which is connected to a wall of the pressure chamber and which adjoins at least a part of the feezing-out unit (1y way of a pipe comprising glass, a metal bar (17) which is connected to a wall of the pressure chamber and which adjoins at least a part of the freezing-out unit (15), and a cooling and/or heating device (18) outside the pressure chamber, which cools or heats the bar (17).

2. A polarizer as set forth in claim 1, wherein the pressure chamber (2) has a plurality of portholes (3).

3. A polarizer as set forth in claim 1, wherein the devices comprising glass include a sample cell (1).

4. A polarizer as set forth in claim 1, wherein there is provided a high-frequency heating means with which an entry window of the sample cell and/or a supply vessel (13) in which alkali metal is disposed are heated.

5. A polarizer as set forth in claim 1, wherein a wire (14) serving as a high-frequency heating means is wound at the edge of an entry window of the sample cell and/or around a supply vessel (13) for alkali metal.

6. A polarizer as set forth in claim 1, wherein a supply vessel (13) is connected to the sample cell (1) by way of a conduit comprising glass, wherein disposed in the supply vessel is a porous substrate comprising metal, in particular a wire mesh, on which alkali metal is disposed.

7. A polarizer as set forth in claim 1, wherein there is provided a laser for heating a supply vessel (13) in which alkali metal is disposed.

8. A polarizer as set forth in claim 1, wherein there are provided means which heat the gas feed conduit to a supply vessel for alkali metal, the supply vessel being disposed upstream of the sample cell.

9. A polarizer as set forth in claim 1, claims wherein an oil bath is provided as means for heating the gas feed conduit to the sample cell.

10. A polarizer as set forth in claim 1, claims wherein the entry window to the sample cell is provided with doping substances for light absorption.

* * * * *